United States Patent
Dondero et al.

(10) Patent No.: US 7,205,631 B2
(45) Date of Patent: Apr. 17, 2007

(54) POLY-SILICON STRINGER FUSE

(75) Inventors: Richard Dondero, Albuquerque, NM (US); Doug Trotter, Albuquerque, NM (US)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 10/537,953

(22) PCT Filed: Dec. 13, 2003

(86) PCT No.: PCT/IB03/05905

§ 371 (c)(1),
(2), (4) Date: Dec. 19, 2005

(87) PCT Pub. No.: WO2004/055893

PCT Pub. Date: Jul. 1, 2004

(65) Prior Publication Data

US 2006/0081959 A1   Apr. 20, 2006

Related U.S. Application Data

(60) Provisional application No. 60/434,136, filed on Dec. 16, 2002.

(51) Int. Cl.
*H01L 29/00* (2006.01)
*H01L 21/331* (2006.01)
(52) U.S. Cl. .................. 257/529; 257/528; 257/530; 438/353; 438/466; 438/467; 438/132
(58) Field of Classification Search .................. None
See application file for complete search history.

(56) References Cited

U.S. PATENT DOCUMENTS

| 4,984,054 A | 1/1991 | Yamada et al. |
| 6,271,574 B1 * | 8/2001 | Delpech et al. ............ 257/529 |

FOREIGN PATENT DOCUMENTS

| EP | 0 445 317 | 9/1991 |
| EP | 1103858 | * 5/2001 |

* cited by examiner

*Primary Examiner*—Leonardo Andujar
*Assistant Examiner*—Fazli Erdem
(74) *Attorney, Agent, or Firm*—Peter Zawilski

(57) ABSTRACT

A polysilicon silicide stringer fuse is constructed having a narrow width by using an overlay tolerance of the photo stepper tool instead of the minimum critical dimension tolerance of the stepper tool. In an example embodiment, a fuse (200) for integration within a semiconductor comprises depositing an insulating layer (205) adjacent to the semiconductor substrate (203). A silicon layer (201) is formed with a first silicon material having a first resistance deposited adjacent the insulating layer (205). The silicon layer has a first width. A metal silicide stringer (202), having a second resistance different from the first resistance is deposited over a portion of the first silicon material (201) and having a second width that is less than the first width within at least a portion thereof. The metal silicide conducts current therethrough with approximately the second resistance and agglomerates in response to a programming current other than the conduct current therethrough with a same second resistance.

17 Claims, 3 Drawing Sheets

POLY-SILICON STRINGER FUSE

CROSS REFERENCE TO RELATED APPLICATION

Figure 1:
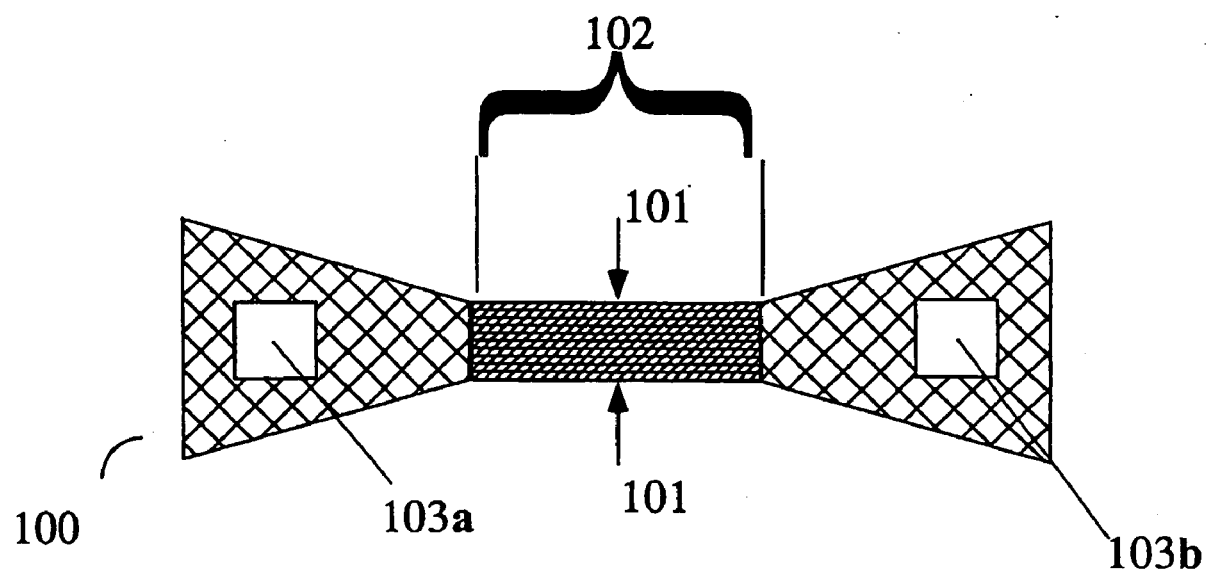

This application claims the benefit of U.S. provisional application Ser. No. 60/434,136 filed 16 Dec. 2002, which is incorporated herein by reference.

The invention relates to the area of integrated circuits and more specifically in the area multi-layer fusible resistors.

In integrated circuits it is often desirable to be able to form permanent connections on the integrated circuit after it is manufactured, or to permanently store information. Typically, fuses are provided within the integrated circuits in order to form fusible links. These fusible links exhibit binary operation in that they exhibit a first resistance when manufactured and may exhibit a second other resistance when programmed. Thus, they allow for encoding of programming information after manufacture and encapsulation of the integrated circuit. A fuse as such is disclosed in Alavi, et al. "A PROM Element based on Silicide Agglomeration of Poly Fuses in a CMOS Logic Process" IEEE TED, December 1997.

The fuses are programmed using a current source that has a sufficient current to overcome a current threshold of the fuse in order to "program" the fuse by changing its resistive properties from a first resistance to a second other resistance. Of course, due to manufacturing tolerances, the second resistances typically vary from fuse to fuse. For example, U.S. Pat. No. 6,356,496, entitled "Resistor fuse," details a resistor fuse for use in a semiconductor device having an operating voltage. The resistor fuse has a predetermined current threshold and is configured to open if a current through the resistor fuse at the operating voltage exceeds the current threshold. Unfortunately, the manufacturing tolerances of this fuse are such that a difference between current thresholds for subsequently produced fuses varies and is difficult to control manufacture using known processes. In U.S. Pat. No. 6,337,507, titled "Silicide Agglomeration Fuse Device with Notches to Enhance Programmability," notches are provided along a length of the fuse to enhance programmability. At these notches, less current is required to overcome the current threshold for programming of the fuse. Unfortunately, again the width of this notched region is difficult to control and hence the programming current varies for fuses manufactured with similar design and manufacturing processes.

A need therefore exists to be able to manufacture fusible links that have a similar current threshold. It is therefore an object of the invention to provide a method of manufacturing of a fusible link that allows for a more controllable current threshold than that which has been available in the prior art.

A polysilicon silicide stringer fuse is constructed having a narrow width by using an overlay tolerance of the photo stepper tool instead of the minimum critical dimension tolerance of the stepper tool. By creating a narrow width of silicide on top of the polysilicon line, it is easier to "blow" or agglomerate the silicide fuse with an applied voltage.

In a example embodiment, there is provided a fuse for integration within a semiconductor circuit comprising: an insulating layer deposited adjacent the semiconductor substrate; a silicon layer formed a first silicon material having a first resistance deposited adjacent the insulating layer, the silicon layer having a first width; and, a metal silicide stringer having a second resistance different from the first resistance deposited over a portion of the first silicon material and having a second width that is less than the first width within at least a portion thereof, the metal silicide for conducting current therethrough with approximately the second resistance and for agglomerating in response to a programming current to other than conduct current therethrough with a same second resistance.

In another example embodiment, there is also provided a method of manufacturing a silicided polysilicon fuse comprising the steps of: depositing an insulating layer on a semiconductor substrate; depositing polysilicon adjacent the insulating layer; forming a silicide protection layer adjacent the polysilicon; removing a portion of the silicide protection layer to reveal polysilicon therebelow; providing a mask for masking other than the revealed polysilicon; aligning the mask with the semiconductor substrate; and, forming a metal silicide layer adjacent the revealed polysilicon, the metal silicide layer for forming a conductive path along a length thereof.

In yet another example embodiment, there is also provided a method of manufacturing a fuse comprising the steps of: providing a silicon feature of at least a minimum line width, the minimum line width dependent upon a minimum line width of a stepper tool; and, providing a fusible metal silicide stringer having a low resistivity and having a stringer width substantially less than the minimum line width of the stepper tool.

In yet another example embodiment, there is additionally provided an integrated circuit having a minimum line width and including a stringer fuse having a low resistance metal silicide stringer width substantially less than the minimum line width.

Additional advantages and novel features will be set forth in the description which follows, and in part may become apparent to those skilled in the art upon examination of the following, or may be learned by practice of the invention.

Figure 2A:
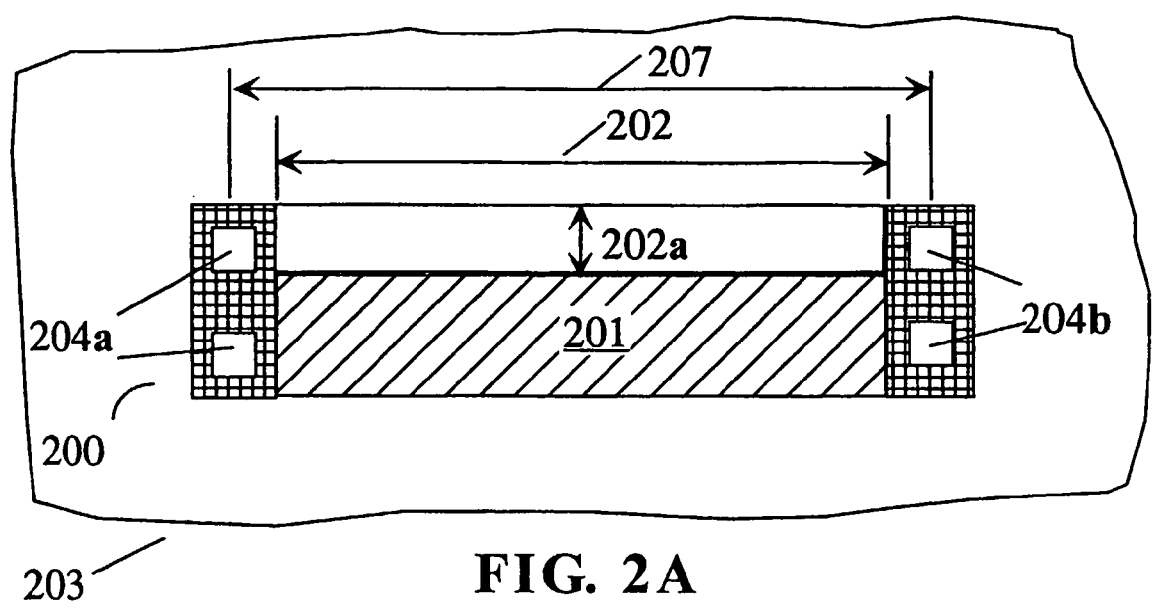
Figure 2B:
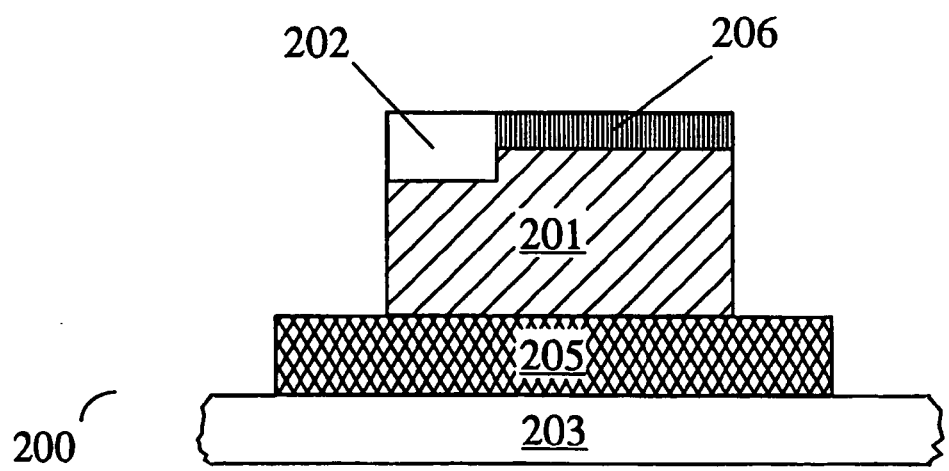
Figure 3:
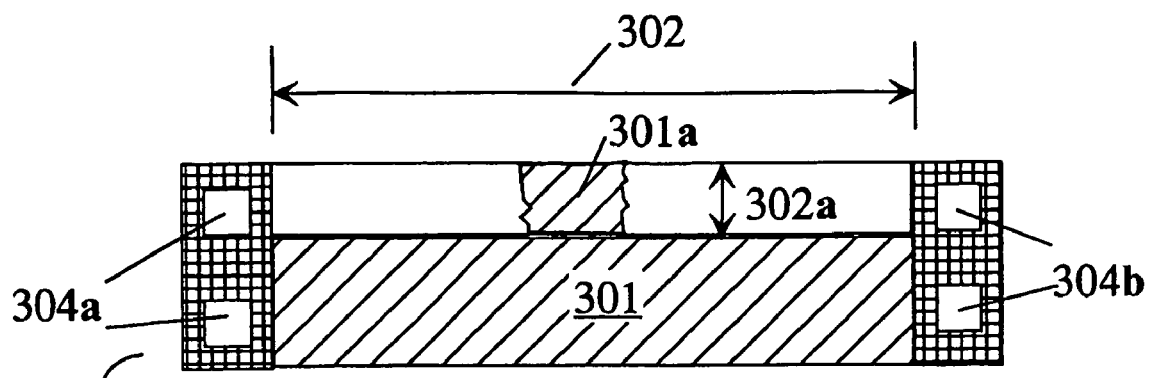
Figure 4:
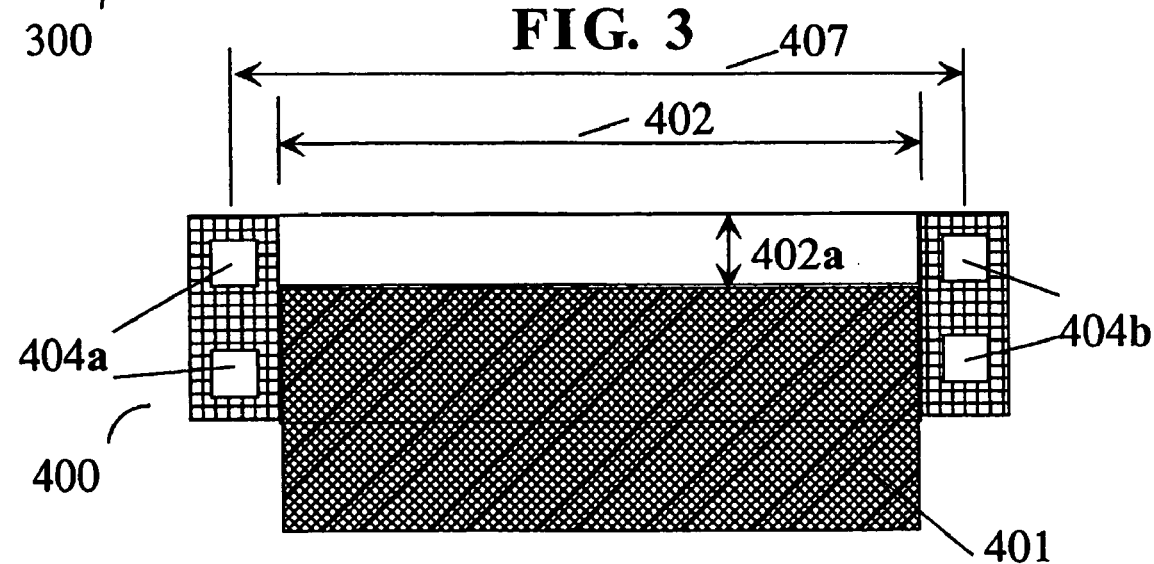
Figure 5:
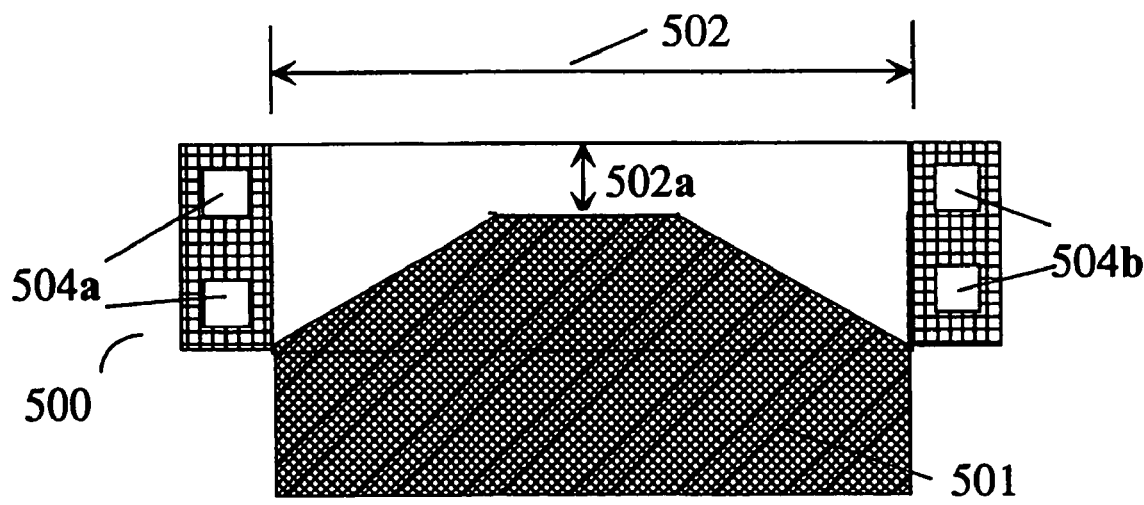

The invention is explained in further details, by way of examples, and with reference to the accompanying drawing wherein:

FIG. 1 (Prior Art) illustrates a typical fuse shape promoting blowing in a narrow region of the resistor having a minimum process width, this fuse has a polysilicon layer on a field oxide with silicide on top;

FIG. 2A in an example embodiment according to the present invention, illustrates how a silicide mask defines a narrow width of a silicide stringer, which has a minimum width equal to technology overlay capability rather than technology critical dimension capability as is shown in FIG. 1;

FIG. 2B illustrates a cross sectional diagram of a silicided polysilicon stringer fuse (SPSF) identifying various layers of FIG. 2A;

FIG. 3 in an another example embodiment, illustrates a blown silicide stringer;

FIG. 4 in an example embodiment, illustrates a silicided polysilicon stringer fuse (SPSF) showing a first possible shape of silicide mask to form narrow silicide stringer as shown in FIG. 2a; and FIG. 5 in another example embodiment, illustrates a silicided polysilicon stringer fuse (SPSF) showing a second possible shape of silicide mask to form narrow region with feathered edges to promote agglomeration in a particular area.

In prior art FIG. 1, a typical polysilicon fuse 100 is shown. A narrow width 101 polysilicon line 102 is formed between two contact points 103a and 103b. An entire width of the polysilicon line 102 is silicided using a silicide process, since there is no mask associated with the actual silicide step. Thus, the silicide is self-aligned to the polysilicon using this process known to those of skill in the art. Typically, the line width 101 of the polysilicon line 102 is at a minimum within this region 102 in order to facilitate "blowing" thereof when subjected to a programming current from a current source that has sufficient current to overcome a current threshold of this polysilicon line. In blowing of the fuse, the resistance changes from having a low resistance to a high resistance. Silicide sheet resistance usually ranges from about 2 ohms/sq to about 9 ohms/sq in the semiconductor industry for forming the low resistance. The polysilicon underneath the silicide is typically of a high sheet resistance in the order of 2000 ohms/sq. In the processes of blowing the polysilicon fuse 100, a high current pulse is provided to terminals 103a and 103b making the silicide agglomerate somewhere along the silicided polysilicon line 102. This agglomeration makes the resistance of the fuse 100 increase dramatically, thus taking it from a low resistance to a high resistance in the programmed state. For the purposes of this disclosure, the term length is herein defined as being along a direction of current flow through the fuse, and the term width is herein defined as being along a direction that traverses the current flow through the fuse.

Unfortunately, manufacturing fuses using conventional processes results in the width 101 of the polysilicon line 102 being dependent upon minimum stepper distances used in the manufacturing process. For example, in a commonly used 0.3 µm processes require features of 0.3 µm or greater on an integrated circuit. Thus, alignment tolerances of the semiconductor substrate and a photolithographic stepper machine are assured to have little effect on the overall circuit. Therefore, the widths 101 of the manufactured fuses of the prior art are limited to those same minimum feature sizes. Thus, when these fuses are blown in a step of programming, the amount of energy required is sufficient to blow similar structures within the integrated circuit. It would of course be advantageous to reduce the fuse cross section in relation to the minimum feature size since this would reduce risk to the overall integrated circuit during programming. Also, this would facilitate programming of the fusible resistors. Unfortunately, when a stepper is designed to support narrower fuse widths, the same stepper supports narrower minimum feature sizes. Thus, little is accomplished in achieving the overall objective by improving the stepper mechanism.

In FIGS. 2A and 2B, an embodiment of the invention is shown, a general structure of a silicided polysilicon stringer fuse (SPSF) 200. In FIG. 2a, a top view of the SPSF 200 is shown, and in FIG. 2b, a cross sectional view of the SPSF 200 is shown.

In manufacturing of the SPSF 200, a typical high ohmic polysilicon layer 201 having a sheet resistance of about 2000 ohms/sq is deposited on top of field oxide layer 205, or some other isolating material for isolating the polysilicon layer 201 from a semiconductor substrate 203. The polysilicon layer 201 is patterned using standard photolithography techniques known to those of skill in the art to form a resistor 207 having a relatively high resistance between contact points 204a and 204b. A silicide protection layer 206 is typically deposited on top of the polysilicon layer 201 in order to mask the polysilicon layer 201 prior to having a silicide layer deposited thereon. As is used in manufacturing resistors, this silicide protection layer 206 may be one of several insulating layers, such as those formed from oxides or nitrides. Preferably, in this case, the silicide protection layer 206 is a combination stack of 200 Å oxide and 270 Å nitride. This silicide protection layer 206 protects the polysilicon layer 201 from salicidation, which would lower its sheet resistance dramatically, to typically less than 10 ohms/sq.

However, in order to form the SPSF 200, a narrow section along the edge of the resistor 207 formed between contact points 204a and 204b has its silicide protection layer removed, prior to subjecting this narrow section to a process of salicidation. This process of salicidation results in the formation of a silicide "stringer" 202 having a minimum width 202a. The removal of this layer allows for a narrow portion of the resistor 207 to become silicided. The salicidation making the sheet resistance of the resistor 207 formed between contact points 204a and 204b greatly decrease along this "stringer" 202, from about 2000 ohms/sq to approximately 10 ohms/sq. Since, in this case the resistance of the resistor is a parallel combination of the silicide stringer resistance and the polysilicon resistance.

Thus, for normal circuit operation, the resistor formed between contact points 204a and 204b is now a relative low-resistance current path because of the low resistance of the silicide stringer 202 in parallel with the polysilicon layer 201. When the SPSF 200 is programmed, this "stringer" of silicide 202 is electrically "blown" by applying a write current sufficient to overcome the threshold current of the stringer during a writing process.

In an example embodiment, a blown SPSF 300 is shown in FIG. 3, where at a portion of the stringer at 301a the silicide has agglomerated, thus exposing the underlying polysilicon layer 301. As demonstrated with other prior art silicide fuses, the silicide agglomerate due to the high temperature generated from the write current conducting through the resistor between contact points 304a and 304b. Agglomeration causes the silicide layer 301 to form at least a discontinuity 301a preferably at a point along a length thereof, resulting in an opening 301a in the silicide layer. Preferably, the agglomeration occurs at a point where the width 302a of the stringer is at a minimum. When the SPSF 200 is in normal use in an electronic circuit, this opening in the silicide layer results in current having to flow through the relatively highly resistive polysilicon layer 301. Thus a difference in resistance between the blown and unblown SPSF 300 is readily observed, providing an indication as to whether the SPSF 300 is in a programmed or unprogrammed state, respectively.

In pure digital CMOS applications, there generally is no silicide mask associated with the silicide process. However, the process may be modified to have a silicide process incorporated so that programmable elements may be included. In analog applications, in which polysilicon resistors are used, there is a silicide mask that allows the definition of where silicide will be formed. Generally, polysilicon resistors are protected from salicidation. Thus, a similar mask to those used in analog application is used to pattern the SPSF as described herein below.

In FIG. 4, the use of a silicide mask 401 is shown in order to control a shape of the silicided layer used within the SPSF 400. Using the silicide mask 401, the shape of the SPSF is constructed to be similar to prior art silicide fuses that rely on a narrow line width 202a of the polysilicon layer. Referring back to FIG. 1, typical fuses have two wide regions 104 and a narrow region 101 in between to promote "blowing" of the fuse in this narrow region 101.

The mask 401 facilitates providing a reproducible width 402a of the stringer, which in turn allows for improved control over this width to allow for a more consistent programming current threshold to be observed between different manufactured SPSFs. Reproducible blowing is preferable for device parametric control. Because of the shape of the mask, the poly-silicon stays wider than the stringer along the length of the resistor 407.

The silicide mask is either used to expose a narrow stringer 402a along a length of the polysilicon, such as that shown in FIG. 4, or it too can be formed to promote agglomeration of the silicide in a certain area by essentially funneling the current to a narrow region 502a as is shown in FIG. 5. In this case the shape of the silicide mask 501 is such that is promotes agglomeration of the silicide in an approximate middle 502a portion of the length of the stringer 502 during a programming operation.

In forming of the SPSF 500, there is advantageously little difference between the actual layers used in constructing the SPSF 500 when compared to other silicide fuses described in the prior art.

Referring back to FIGS. 2A and 2B, generally, a polysilicon layer 201 is deposited and patterned on oxide layer 205. The polysilicon layer 201 may either be low-doped p-type or n-type, as long as it provides a fairly high sheet resistance so that after the stringer 202 is blown, the remaining resistance of the resistor 207 is high. The polysilicon layer 201 is optionally of varying thickness, as long as the subsequent silicide layer 202 formation thereon, does not consume all of the polysilicon layer 201. Typically, the metal used to form the silicide layer is platinum (Pt), to form PtSi, titanium (Ti), to form $TiSi_2$ tungsten (W) to form $WSi_2$. Of course, processes used to form these silicides are described in the literature. Other silicides such as for example, tantalum (Ta) to form $TaSi_2$ and molybdenum (Mo) to form $MoSI_2$, compatible with a given process and of sufficiently low sheet resistance may also be used.

By using a stringer of silicide to form a portion of the SPSF that is blown, the width of the stringer 202 is controlled by overlay tolerance of the photolithographic stepper used for applying the silicide mask and not by the minimum line width supported by the stepper. Furthermore, by creating a narrow width of silicide on top of the poly-silicon line, it is easier to "blow" or agglomerate the silicide fuse with an applied voltage, since a more narrow width is created using the overlay tolerance of the photolithographic stepper tool, for instance 0.3 μm, instead of a minimum line width of approximately 0.5 μm. Hence, to get a narrower silicide fuse, one does not have to buy a more expensive photolithographic machine. Thus, using existing processes and equipment, an improved SPSF is provided that offers reproducible blowing over that demonstrated in the prior art. Having these fuses spaced closer together results in smaller integrated circuits having fuse programming capabilities.

Additionally, these SPSFs have applications in use with normal fuses, but are not limited thereof. Additionally they are useable in circuits that offer voltage reference, circuit isolation, and within PROM elements.

While the present invention has been described with reference to several particular example embodiments, those skilled in the art will recognize that many changes may be made thereto without departing from the spirit and scope of the present invention, which is set forth in the following claims

What is claimed is:

1. A fuse for integration within a semiconductor circuit comprising: an insulating layer deposited adjacent the semiconductor substrate; a silicon layer formed a first silicon material having a first resistance deposited adjacent the insulating layer, the silicon layer having a first width; and, a metal silicide stringer having a second resistance different from the first resistance deposited over a portion of the first silicon material and having a second width that is less than the first width within at least a portion thereof, the metal silicide for conducting current therethrough with approximately the second resistance and for agglomerating in response to a programming current to other than conduct current therethrough with a same second resistance.

2. The fuse as recited in claim 1 wherein the silicon layer is a poly-silicon layer.

3. The fuse as recited in claim 1 wherein the silicide layer is a tungsten silicide layer.

4. The fuse as recited in claim 1 wherein the silicide layer is a platinum silicide layer.

5. The fuse as recited in claim 1 wherein the first resistance is higher than the second resistance.

6. The resistor fuse as recited in claim 1 wherein the resistor fuse forms a portion of a non-volatile multi-state memory cell.

7. The resistor fuse as recited in claim 6 wherein the memory cell is one-time programmable.

8. The resistor fuse as recited in claim 1 wherein the insulating layer comprises an oxide layer.

9. A method of manufacturing a silicided polysilicon fuse comprising the steps of: depositing an insulating layer on a semiconductor substrate; depositing polysilicon adjacent the insulating layer; forming a silicide protection layer adjacent the polysilicon; removing a portion of the silicide protection layer to reveal polysilicon therebelow; providing a mask for masking other than the revealed polysilicon; aligning the mask with the semiconductor substrate; and, forming a metal silicide layer adjacent the revealed polysilicon, the metal silicide layer for forming a conductive path along a length thereof.

10. A method according to claim 9 comprising the step of providing electrical contacts on opposite sides of the length of the metal silicide layer.

11. A method according to claim 9 wherein the insulating layer comprises an oxide layer.

12. A method according to claim 9 wherein the polysilicon layer is patterned.

13. A method according to claim 9 wherein the step of forming a silicide protection layer is performed by depositing a silicide protection layer on the polysilicon.

14. A method according to claim 9 wherein the step of forming a silicide protection layer is performed by reacting at least a chemical with the polysilicon.

15. A method according to claim 9 wherein the step of removing a portion of the silicide protection layer comprises a step of etching a portion of the silicide protection layer.

16. A method according to claim 9 forming a metal silicide layer comprises a step of: depositing a metal silicide adjacent the revealed polysilicon.

17. A method according to claim 9 forming a metal silicide layer comprises a step of: reacting at least a chemical including a metal with the revealed polysilicon.

* * * * *